(12) United States Patent
Tam et al.

(10) Patent No.: US 10,401,418 B2
(45) Date of Patent: Sep. 3, 2019

(54) METHOD AND APPARATUS FOR NONDESTRUCTIVE TESTING OF A GAS DISCHARGE TUBE

(71) Applicant: SPAWAR Systems Center Pacific, San Diego, CA (US)

(72) Inventors: Daniel Wing Shum Tam, San Diego, CA (US); Gregory Alan Larson, Spring Valley, CA (US); Christopher Agustin Dilay, San Diego, CA (US); David Russell Hilton, Carlsbad, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 233 days.

(21) Appl. No.: 15/452,429

(22) Filed: Mar. 7, 2017

(65) Prior Publication Data

US 2018/0217199 A1 Aug. 2, 2018

Related U.S. Application Data

(60) Provisional application No. 62/453,140, filed on Feb. 1, 2017.

(51) Int. Cl.
*G01R 31/24* (2006.01)
*G01R 27/26* (2006.01)

(52) U.S. Cl.
CPC .................................. *G01R 31/245* (2013.01)

(58) Field of Classification Search
CPC ... G01R 31/245; G01R 27/2605; G01R 27/28
See application file for complete search history.

(56) References Cited

U.S. PATENT DOCUMENTS

| 4,112,331 | A | * | 9/1978 | Verbeek | ................. | H05B 41/36 |
| | | | | | | 315/125 |
| 5,756,876 | A | * | 5/1998 | Wetzel | ................. | G01F 23/265 |
| | | | | | | 324/601 |
| 2006/0078032 | A1 | * | 4/2006 | Carroll | .................... | H01S 3/223 |
| | | | | | | 372/89 |
| 2007/0262723 | A1 | * | 11/2007 | Ikenouchi | ........ | H01J 37/32174 |
| | | | | | | 315/111.21 |

(Continued)

OTHER PUBLICATIONS

NEXTEK; Gas Discharge Tube (GDT) based Arrestors—Servicing/Testing; available online at http://nextek.com/education-center/gdt-arrestor-testing-screening/; website says posted by Stirltech on Jan. 26, 2015 but document dated Mar. 2, 2016.

*Primary Examiner* — Akm Zakaria
(74) *Attorney, Agent, or Firm* — Naval Information Warfare Center, Pacific; Kyle Eppele; James Eric Anderson

(57) ABSTRACT

A method and apparatus for nondestructive testing of a gas discharge tube (GDT) comprising: electrically connecting a first terminal of the GDT to a first port of a vector network analyzer (VNA); electrically connecting a second terminal of the GDT to a second port of the VNA; measuring S parameters with the VNA; determining GDT capacitance and insertion loss based on the measured S parameters; comparing the determined capacitance and insertion loss of the GDT with a threshold value to determine if the GDT is functional.

8 Claims, 8 Drawing Sheets

(56) References Cited

U.S. PATENT DOCUMENTS

| | | | | |
|---|---|---|---|---|
| 2010/0150215 A1* | 6/2010 | Black | ............ | H04B 3/54 |
| | | | | 375/224 |
| 2012/0112774 A1* | 5/2012 | Ashton | ............ | G01R 27/2605 |
| | | | | 324/683 |
| 2014/0115950 A1* | 5/2014 | Chornenky | ............ | A01M 1/223 |
| | | | | 43/132.1 |
| 2016/0320317 A1* | 11/2016 | Wang | ............ | G01N 22/00 |

* cited by examiner

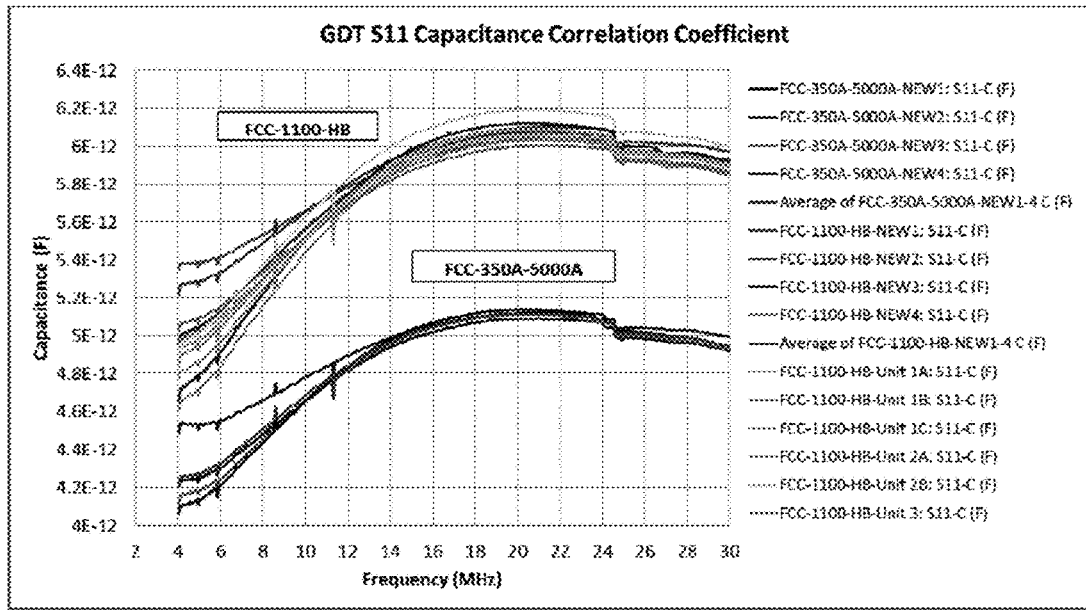

*Fig. 5A*

| GDT | GDT S11 Capacitance Correlation Coefficient | GDT Condition |
|---|---|---|
| FCC-350A-5000A-NEW1: S11-C (F) | 0.9973362090 | New (Good) |
| FCC-350A-5000A-NEW2: S11-C (F) | 0.9999718833 | New (Good) |
| FCC-350A-5000A-NEW3: S11-C (F) | 0.9998404772 | New (Good) |
| FCC-350A-5000A-NEW4: S11-C (F) | 0.9994617117 | New (Good) |
| Average of FCC-350A-5000A-NEW1-4 C (F) | 1 | Self (Good) |
| FCC-1100-HB-NEW1: S11-C (F) | 0.9959695126 | New (Good) |
| FCC-1100-HB-NEW2: S11-C (F) | 0.9979546826 | New (Good) |
| FCC-1100-HB-NEW3: S11-C (F) | 0.9992115929 | New (Good) |
| FCC-1100-HB-NEW4: S11-C (F) | 0.9989802748 | New (Good) |
| Average of FCC-1100-HB-NEW1-4 C (F) | 1 | Self (Good) |
| FCC-1100-HB-Unit 1A: S11-C (F) | 0.9992115929 | Used (Good) |
| FCC-1100-HB-Unit 1B: S11-C (F) | 0.9998350728 | Used (Good) |
| FCC-1100-HB-Unit 1C: S11-C (F) | 0.9999816601 | Used (Good) |
| FCC-1100-HB-Unit 2A: S11-C (F) | 0.9999446430 | Used (Good) |
| FCC-1100-HB-Unit 2B: S11-C (F) | 0.9997457596 | Used (Good) |
| FCC-1100-HB-Unit 3: S11-C (F) | 0.9996151037 | Used (Good) |

*Fig. 5B*

GDTs New and Used Tests and Results

| GDT (New and Used) | GDT Correlation Coefficient | GDTs Condition |
|---|---|---|
| FCC-350A-5000A-NEW1: S21 (dB) | 0.999998588 | New (Good) |
| FCC-350A-5000A-NEW1: S12 (dB) | 0.999998835 | New (Good) |
| FCC-350A-5000A-NEW2: S21 (dB) | 0.999999086 | New (Good) |
| FCC-350A-5000A-NEW2: S12 (dB) | 0.999999033 | New (Good) |
| FCC-350A-5000A-NEW3: S21 (dB) | 0.999999265 | New (Good) |
| FCC-350A-5000A-NEW3: S12 (dB) | 0.999998857 | New (Good) |
| FCC-350A-5000A-NEW4: S21 (dB) | 0.999999062 | New (Good) |
| FCC-350A-5000A-NEW4: S12 (dB) | 0.999999338 | New (Good) |
| Average of FCC-350A-5000A-NEW1-4 (dB) | 1 | Self New (Good) |
| FCC-1100-HB-NEW1: S21 (dB) | 0.999999416 | New (Good) |
| FCC-1100-HB-NEW1: S12 (dB) | 0.999998953 | New (Good) |
| FCC-1100-HB-NEW2: S21 (dB) | 0.999999125 | New (Good) |
| FCC-1100-HB-NEW2: S12 (dB) | 0.999999441 | New (Good) |
| FCC-1100-HB-NEW3: S21 (dB) | 0.999999514 | New (Good) |
| FCC-1100-HB-NEW3: S12 (dB) | 0.999999444 | New (Good) |
| FCC-1100-HB-NEW4: S21 (dB) | 0.999998975 | New (Good) |
| FCC-1100-HB-NEW4: S12 (dB) | 0.999999363 | New (Good) |
| Average of FCC-1100-HB-NEW1-4 (dB) | 1 | Self New (Good) |
| FCC-1100-HB-Unit 1A: S21 (dB) | 0.999999514 | Used (Good) |
| FCC-1100-HB-Unit 1A: S12 (dB) | 0.999999464 | Used (Good) |
| FCC-1100-HB-Unit 1B: S21 (dB) | 0.999999120 | Used (Good) |
| FCC-1100-HB-Unit 1B: S12 (dB) | 0.999999369 | Used (Good) |
| FCC-1100-HB-Unit 1C: S21 (dB) | 0.999999455 | Used (Good) |
| FCC-1100-HB-Unit 1C: S12 (dB) | 0.999999591 | Used (Good) |
| FCC-1100-HB-Unit 2A: S21 (dB) | 0.999999227 | Used (Good) |
| FCC-1100-HB-Unit 2A: S12 (dB) | 0.999999487 | Used (Good) |
| FCC-1100-HB-Unit 2B: S21 (dB) | 0.999999108 | Used (Good) |
| FCC-1100-HB-Unit 2B: S12 (dB) | 0.999999517 | Used (Good) |
| FCC-1100-HB-Unit 3: S21 (dB) | 0.999998789 | Used (Good) |
| FCC-1100-HB-Unit 3: S12 (dB) | 0.999999521 | Used (Good) |

*Fig. 7*

METHOD AND APPARATUS FOR NONDESTRUCTIVE TESTING OF A GAS DISCHARGE TUBE

CROSS-REFERENCE TO RELATED APPLICATION

This application claims the benefit of U.S. Provisional Application No. 62/453,140, filed 1 Feb. 2017, titled "Method and Apparatus for Nondestructively Testing a Gas Discharge Tube" (Navy Case #105003).

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 105003.

BACKGROUND OF THE INVENTION

In the past, testing of a gas discharge tube was performed using a hipot tester, a dielectric withstand tester, or a current-limited high voltage DC power supply. Prior art methods of testing gas discharge tubes for degradation over time tended to be expensive and often would result in the destruction of the gas discharge tube being tested. For example, traditional testing of gas discharge tubes that use clamping voltage and DC breakdown voltage from a surge protector test set can lead to arcing between the two electrodes of the gas discharge tube. A new, nondestructive method of testing gas discharge tubes is needed.

SUMMARY

Disclosed herein is a method for nondestructive testing of a gas discharge tube (GDT) comprising the following steps. The first step provides for electrically connecting a first terminal of the GDT to a first port of a vector network analyzer (VNA). The next step provides for electrically connecting a second terminal of the GDT to a second port of the VNA. The next step provides for measuring S parameters with the VNA. The next step provides for determining GDT capacitance based on the measured S parameters. The next step provides for comparing the determined capacitance of the GDT with a threshold value to determine if the GDT is functional.

The method disclosed herein may be practiced through the use of a GDT tester comprising: a VNA, a processor, and a test fixture. The VNA has a first port and a second port. The processor is operatively coupled to the VNA. The test fixture is configured to allow a first terminal of a test GDT to be electrically connected to the first port and a second terminal of the test GDT to be electrically connected to the second port. The VNA is configured to measure the $S_{11}$, $S_{21}$, $S_{12}$ and $S_{22}$ parameters of the test GDT, and the processor is configured to calculate the capacitances of the test GDT at the first and second ports based on the measured S parameters, and wherein the processor is further configured to compare the calculated capacitances with a threshold value to determine if the test GDT is functional.

An embodiment of the method disclosed herein may be described as comprising the following steps. The first step provides for electrically connecting a first terminal of a first GDT to a first port of a vector network analyzer (VNA). The next step provides for electrically connecting a second terminal of the first GDT to a second port of the VNA. The next step provides for measuring S parameters with the VNA to obtain frequency-dependent reflection and transmission properties of the first GDT. The next step provides for determining first GDT capacitance at the first and second ports based on the measured S parameters related to the reflection properties. The next step provides for determining first GDT insertion loss at the first and second ports based on the measured S parameters related to the transmission properties. The next step provides for comparing the determined capacitance and insertion loss of the first GDT with threshold capacitance and insertion loss values respectively to determine if the first GDT is functional.

BRIEF DESCRIPTION OF THE DRAWINGS

Throughout the several views, like elements are referenced using like references. The elements in the figures are not drawn to scale and some dimensions are exaggerated for clarity.

FIG. 5A is a graph of example calculated capacitances of several different gas discharge tubes at several different frequencies.

FIG. 5B is a chart of capacitance correlation coefficients from 4-30 MHz for several different gas discharge tubes.

FIG. 7 is a chart of insertion loss correlation coefficients from 2-30 MHz for several different gas discharge tubes.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
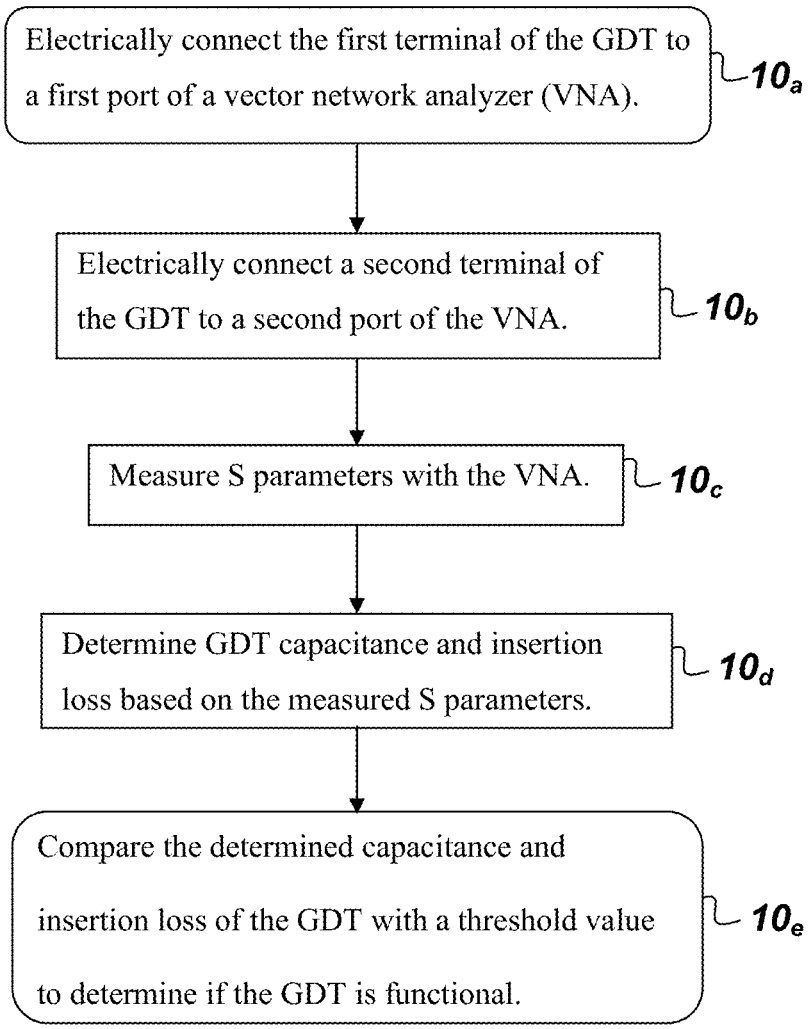
FIG. 1 is a flowchart of a method for nondestructive testing of a gas discharge tube.

FIG. 1 is a flowchart of an embodiment of a method 10 for nondestructive testing of a gas discharge tube (GDT). The GDT may be any make/model of GDT with known or unknown characteristics. The GDT may be new or used. GDTs are often used as terminal protection devices (sometimes referred to as transient protection devices) designed to protect electronic devices from electricity surges. Method 10 comprises, consists of, or consists essentially of the following steps. The first step $10_a$ provides for electrically connecting a first terminal of the GDT to a first port of a vector network analyzer (VNA). Any VNA having at least two ports and capable of measuring S parameters may be used with method 10. The next step $10_b$ provides for electrically connecting a second terminal of the GDT to a second port of the VNA. The next step $10_c$ provides for measuring S parameters with the VNA. The next step $10_d$ provides for determining GDT capacitance and insertion loss based on the measured S parameters. The next step $10_e$ provides for comparing the determined capacitance and insertion loss of the GDT with a threshold value to determine if the GDT is functional.

Figure 2:
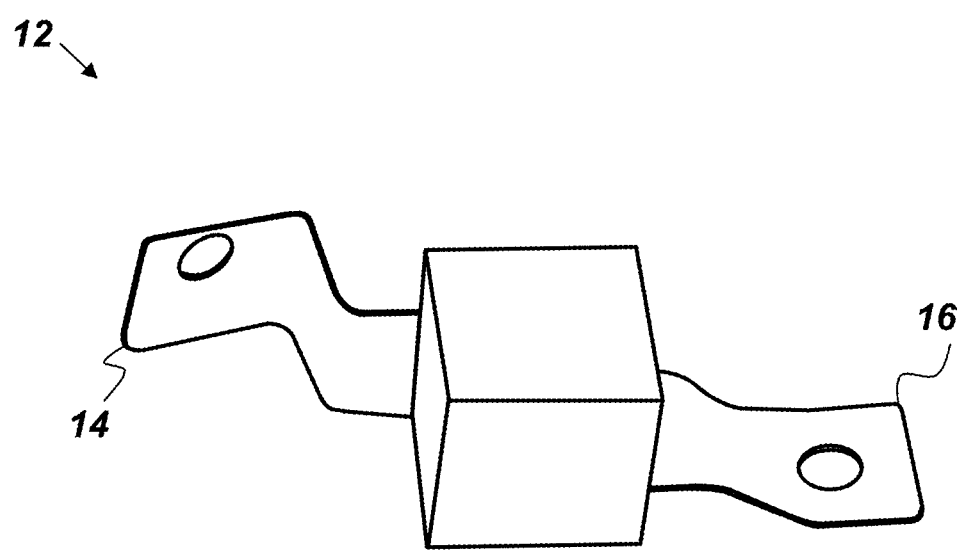
FIG. 2 is an illustration of a sealed gas discharge tube.

FIG. 2 is an illustration of an example of a test GDT 12 having a first terminal 14 and a second terminal 16 that may be tested by method 10. In many scenarios, no electrical performance characteristics of the test GDT 12 are known before the testing of the test GDT 12. The threshold value may be determined by calculating the average measured capacitance of a plurality of newly manufactured GDTs. The physics of a sealed GDT, such as the one depicted in FIG. 2, are similar to a capacitor having two internal parallel plate electrodes separated by a gas-filled gap. Thus the mathematical model of the parallel-plate capacitance equation may be used to describe the capacitance of a GDT.

$$C = \frac{\in A}{d} \quad (1)$$

Where C is the frequency-dependent capacitance, $\in$ is the electric permittivity of the gas material, A is the area of the electrodes, and d is the distance between the two electrodes. Equation (1) may be rewritten to solve for d as follows:

$$d = \frac{\in A}{C} \quad (2)$$

Figure 3:
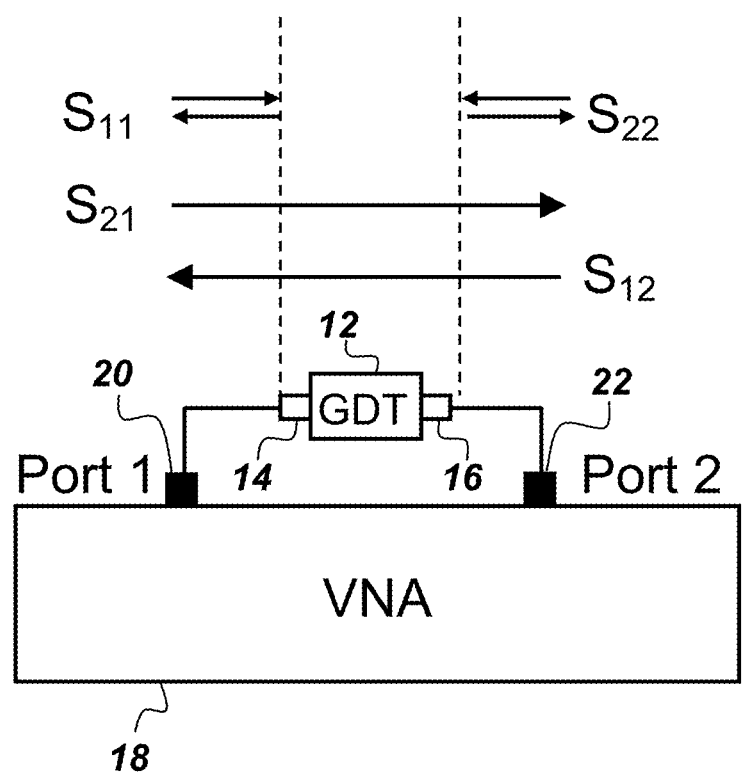
FIG. 3 is a representation of a two-port vector network analyzer connected to a gas discharge tube.

FIG. 3 is a representation of a two-port VNA 18 connected to the test GDT 12. The VNA 18 has a first port 20 and a second port 22 electrically connected to the first and second terminals of the test GDT 12 respectively. The objective of using the parallel-plate capacitor model for the GDT is to obtain the device impedance and insertion loss as a function of frequency. The frequency-dependent reflection and transmission properties of the GDT can be obtained using a VNA two-port S-Parameter measurement approach in a series configuration such as is shown in FIG. 3. The two-port S-parameters have the following generic descriptions: $S_{11}$ is the input port voltage reflection coefficient; $S_{12}$ is the reverse voltage gain; $S_{21}$ is the forward voltage gain; and $S_{22}$ is the output port voltage reflection coefficient.

The impedance in terms of capacitance may be determined from the reflection property. In some cases, the capacitance of a given GDT may be disclosed by a manufacturer. The insertion loss may be determined from the GDT transmission property. Manufacturers of GDTs do not provide insertion loss specifications. With limited GDT electrical performance specifications from the manufacturer and no design material and dimension information (e.g., gas mixture and pressure, gap geometry, gap distance, and electrode alloy make-up) available on a given GDT, a statistical an embodiment of method 10 uses a statistical approach to address the pass/fail criteria of the given GDT using the VNA 2-port S-Parameters measurement techniques. The assumption for the pass/fail criteria is that if no physical changes were made to the GDT internal and external structures and materials over time, the capacitance and insertion loss function of frequencies should be relatively stable like a new unit.

The procedures below summarize a quantitative research statistical approach for GDT capacitance and insertion loss measurements to determine the pass/fail criteria. Capacitance may be calculated from the $S_{11}$ and $S_{22}$ measurements as follows:

Capacitance from S Parameters $$\frac{-1}{j2\pi f C} = Z_0 \frac{1 + (S_{11} \text{ or } S_{22})}{1 - (S_{11} \text{ or } S_{22})} \quad (3)$$

Where
f=Frequnecy (Hz)
C=Capacitance
$Z_0$=Characteristic impedance 50 ohms
Equation (3) may be rewritten as follows to solve for $C_1$ at the first port 20:

$$C_1 = -1/(2*3.14159*f*ABS((50*2*IMAG(S_{11}))/((1-REAL(S_{11}))^2+IMAG(S_{11})^2))) \quad (4)$$

Equation (4) may also be expressed as follows:

$$C_1 = \frac{-1}{2*\pi*f*\left|\frac{50*2*IMAG(S_{11})}{(1-REAL(S_{11}))^2+IMAG(S_{11})^2}\right|}$$

Equation (3) may be rewritten as follows to solve for $C_2$ at the second port 22:

$$C_2 = -1/(2*3.14159*f*ABS((50*2*IMAG(S_{22}))/((1-REAL(S_{22}))^2+IMAG(S_{22})^2))) \quad (5)$$

Equation (5) may also be expressed as follows:

$$C_2 = \frac{-1}{2*\pi*f*\left|\frac{50*2*IMAG(S_{22})}{(1-REAL(S_{22}))^2+IMAG(S_{22})^2}\right|}$$

Insertion loss may be obtained from the $S_{21}$ and $S_{12}$ measurements.

Insertion Loss from S Parameters

The insertion loss ($IL_1$) at the first port 20 may be calculated from the $S_{21}$ measurement according to the following equation:

$$IL_1 = -20 \log_{10}|S_{21}| dB \quad (6)$$

The insertion loss ($IL_2$) at the second port 22 may be calculated from the $S_{12}$ measurement according to the following equation:

$$IL_2 = -20 \log_{10}|S_{12}| dB \quad (7)$$

Figure 4:
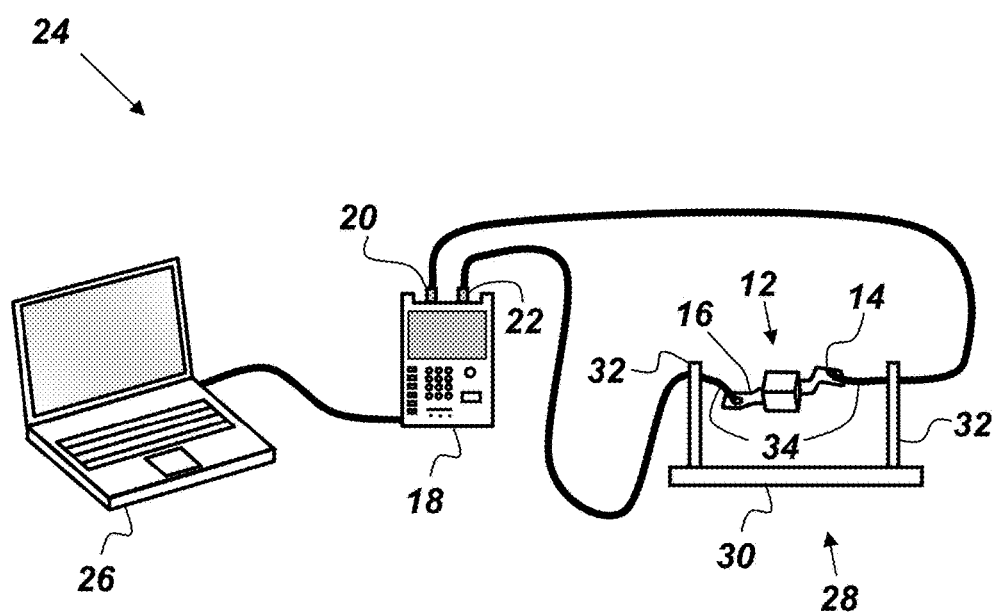
FIG. 4 is an illustration of a gas discharge tube tester.

FIG. 4 is an illustration of a GDT tester 24 that comprises the VNA 18, a processor 26, and a test fixture 28. The processor 26 is operatively coupled to the VNA 18 such that when the VNA 18 measures the $S_{11}$, $S_{21}$, $S_{12}$ and $S_{22}$ parameters of the test GDT 12, the processor 26 is configured to calculate the capacitances and/or the insertion loss of the test GDT 12 at the first and second ports 20 and 22 respectively based on the measured S parameters. The processor 26 may also be used to compare the calculated capacitances and insertion losses with threshold values to determine if the test GDT 12 is functional. The test fixture 28 serves to hold the test GDT 12 in position such that the first terminal 14 is electrically connected to the first port 20 and the second terminal 16 is electrically connected to the second port 22. The test fixture 28 may be made of a base ground plate 30 with two brackets 32 with measurement clips 34 (shown in FIG. 4 as being connected to the first and second terminals 14 and 16).

FIG. 5A is a graph of example calculated capacitances of several different GDTs at several different frequencies. One way to calculate the capacitance and insertion loss threshold values is to calculate an average capacitance and an average insertion loss from a plurality of new GDTs. These averages may be used as the performance specification. For capacitance, a correlation analysis may then be performed of the test GDT 12's $S_{11}$ and $S_{22}$ trace data against the average capacitance. The correlation coefficient from the correlation analysis provides a pass/fail metric to determine the functionality of new and previously installed GDTs. FIG. 5B is a chart of capacitance correlation coefficients and GDT condition from 4-30 MHz from the $S_{ii}$ measurement for several different GDTs. All of the measured GDTs whose measurement data is displayed in FIG. 5B had a capacitance correlation coefficient of greater than 0.995 and were thus deemed to be functional GDTs.

Figure 6:
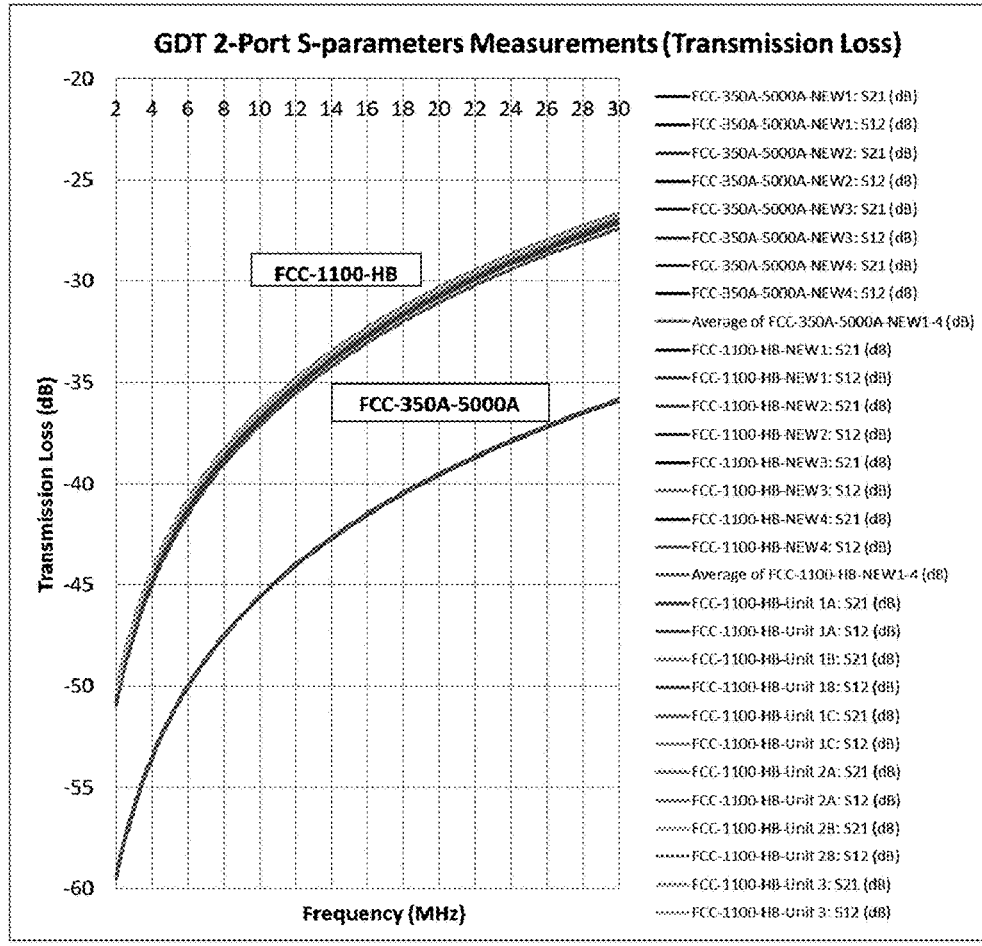
FIG. 6 is a graph of the determined transmission loss of several different gas discharge tubes at different frequencies.

FIG. 6 is a graph of the determined transmission loss of several different GDTs at different frequencies from the $S_{21}$ and $S_{it}$ measurements. For insertion loss, a correlation analysis may then be performed of any given GDT's $S_{21}$ and $S_{12}$ trace data against the average insertion loss. FIG. 7 is a chart of insertion loss correlation coefficients and GDT condition from 2-30 MHz from the $S_{21}$ and $S_{12}$ trace measurements for several different GDTs. All of the measured GDTs whose measurement data is displayed in FIGS. 6 and 7 had an insertion loss correlation coefficient of greater than 0.999998 and were thus deemed to be functional GDTs.

The inventors of the invention claimed herein have discovered a relationship between a GDT's determined capacitance and its breakdown voltage. Plasma ignition occurs at the Townsend breakdown voltage, which may be measured and expressed as follows:

$$V_{bT} = \frac{d * E_I}{\lambda_e * \ln\left(\frac{d}{\lambda_e}\right)} \qquad (8)$$

Where $V_{bT}$ is the Townsend breakdown voltage (in volts), d is the distance (in meters) from the cathode to the anode, $E_I$ is the ignition energy (in joules), and $\lambda_e$ is the mean free path (in meters). Next, one may substitute the expression for d from equation (2) into equation (8) to yield:

$$V_{bT} = \frac{\frac{\in A}{C} * E_I}{\lambda_e * \ln\left(\frac{\in A}{C\lambda_e}\right)} \qquad (9)$$

Figure 8:
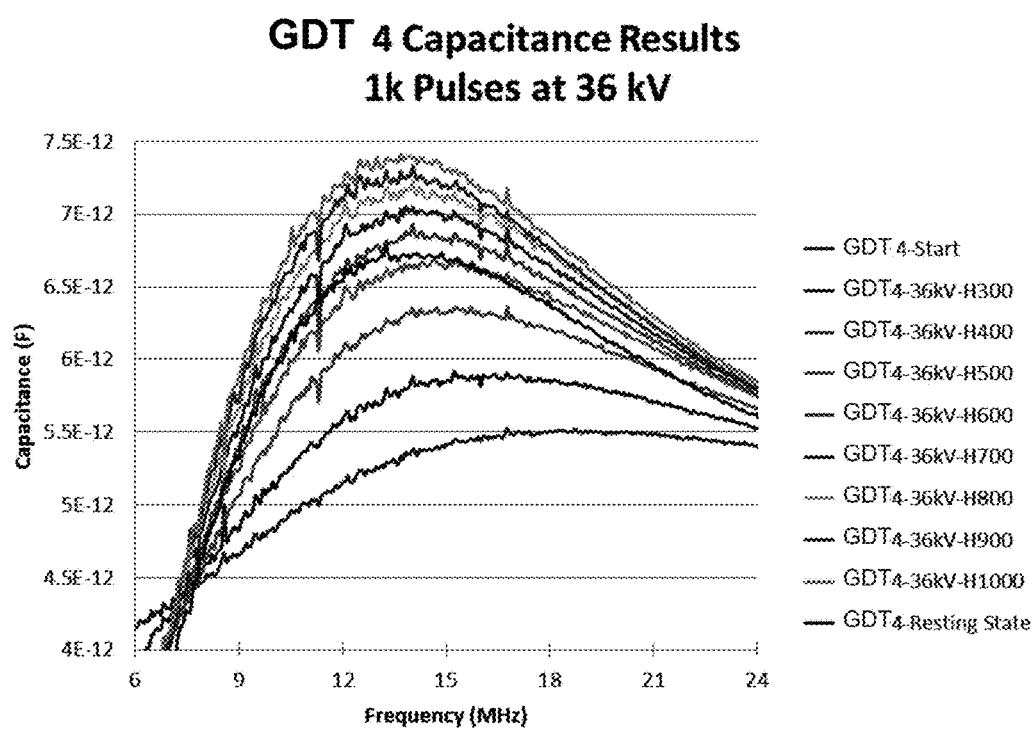
FIG. 8 is a graph of determined capacitance values with respect to various frequencies of a single gas discharge tube after several high voltage pulser injection tests.

FIG. 8 is a graph of determined capacitance values with respect to various frequencies of a single GDT (identified as GDT 9 in FIG. 8) based on $S_{11}$ measurements with a VNA after several high voltage pulser injection tests. A GDT's breakdown voltage may be determined experimentally by subjecting a given GDT to high voltage pulser injection tests. For example, a high voltage injection test may be associated with a predetermined high voltage and high current test waveform that is injected into the primary side of a device to determine how the device behaves at a particular level of current. The primary function of a high voltage injection test is to supply sufficient current to simulate the characteristic of a transient electrical surge waveform for the GDT under test. Starting at 50% of the rated breakdown voltage, the voltage on the high voltage power supply may be slowly increased until a current draw of 1 mA is observed on the power supply. Once this occurs, the voltage reading on the power supply may be recorded as the DC breakdown voltage. The threshold value used in method 10 may be a multiple factor of the breakdown voltage specification as provided by a manufacturer, or it may be established by subjecting a sacrificial GDT to a high voltage pulser injection test and measuring the capacitance afterward, and then selecting the pass and fail threshold value of the test GDT to be a capacitance C that results in 5-10% percentage capacitance changes from the capacitance of a GDT that is known to be functional. An embodiment of method 10 establishes a GDT capacitance relationship to the Townsend breakdown voltage equation as shown in equation 12. This equation relates the capacitance changes due to different high voltage injection hits above the GDT manufacturer breakdown voltage specification.

From the above description of the method 10 for nondestructive testing of a gas discharge tube, it is manifest that various techniques may be used for implementing the concepts of method 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that method 10 is not limited to the particular embodiments described herein, but is capable of many embodiments without departing from the scope of the claims.

We claim:
1. A method for nondestructively testing a first gas discharge tube (GDT) comprising the following steps:
 a. electrically connecting a first terminal of the first GDT to a first port of a vector network analyzer (VNA);
 b. electrically connecting a second terminal of the first GDT to a second port of the VNA;
 c. measuring S parameters with the VNA to obtain frequency-dependent reflection and transmission properties of the first GDT;
 d. determining first GDT capacitances at the first and second ports based on the measured S parameters related to the reflection properties;
 e. determining first GDT insertion losses at the first and second ports based on the measured S parameters related to the transmission properties; and
 f. comparing the determined capacitance and insertion loss of the first GDT with a threshold capacitance value and a threshold insertion loss value respectively to determine if the first GDT is functional.

2. The method of claim 1, wherein the threshold capacitance value is determined by:
 determining capacitances of a plurality of new GDTs according to steps (a-d); and
 averaging the determined capacitances of the plurality of new GDTs, wherein the average determined capacitance is the threshold capacitance.

3. The method of claim 2, wherein step (f) further comprises calculating a correlation coefficient between the determined capacitance of the first GDT and the average of the capacitances of the new GDTs.

4. The method of claim 3, wherein the threshold insertion loss value is determined by:

determining the insertion losses of a plurality of new GDTs according to steps (a-c) and (d); and averaging the determined insertion losses of the plurality of new GDTs, wherein the average determined insertion loss is the threshold insertion loss.

5. The method of claim 4, wherein step (f) further comprises calculating a correlation coefficient between the determined insertion loss of the first GDT and the average of the insertion losses of the new GDTs.

6. The method of claim 5, wherein the first GDT is a used GDT with unknown internal characteristics.

7. The method of claim 5, further comprising the step of subjecting one of the plurality of new GDTs to high voltage pulser injection tests to determine a Townsend breakdown voltage $V_{bT}$ of the new GDT.

8. The method of claim 7, wherein step (f) further comprises comparing the first GDT capacitance at the first and second ports to the Townsend breakdown voltage $V_{bT}$ according to the following relationship:

$$V_{bT} = \frac{\frac{\epsilon A}{C} * E_I}{\lambda_e * \ln\left(\frac{\epsilon A}{C \lambda_e}\right)},$$

where C is the measured capacitance of the first GDT at either the first or second ports, $E_I$ is an ignition energy (in joules), and $\lambda_e$ is a mean free path (in meters), $\in$ is an electric permittivity of a gas within the first GDT, and A is an area of electrodes within the first GDT.

* * * * *